(12) United States Patent
Subramanian et al.

(10) Patent No.: US 6,455,409 B1
(45) Date of Patent: Sep. 24, 2002

(54) DAMASCENE PROCESSING USING A SILICON CARBIDE HARD MASK

(75) Inventors: Ramkumar Subramanian; Dawn M. Hopper, both of San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/793,992

(22) Filed: Feb. 28, 2001

(51) Int. Cl.⁷ ................ H01L 21/4763; H01L 21/44
(52) U.S. Cl. ............. 438/618; 438/637; 438/687
(58) Field of Search .................. 438/618, 637, 438/687

(56) References Cited

U.S. PATENT DOCUMENTS

| | | |
|---|---|---|
| 4,756,977 A | 7/1988 | Haluska et al. |
| 5,866,945 A | 2/1999 | Chen et al. |
| 5,981,354 A | 11/1999 | Spikes et al. |
| 6,083,851 A | 7/2000 | Shields et al. |
| 6,184,128 B1 * | 2/2001 | Wang et al. ........... 438/637 |

* cited by examiner

Primary Examiner—Alexander Ghyka

(57) ABSTRACT

Damascene techniques are implemented using a silicon carbide bard mask to prevent contact between an organic photoresist mask and dielectric material, particularly a low-K dielectric material. Embodiments include etching using a silicon carbide hard mask to form a via opening through a low-K ILD, depositing an overlying ILD, e.g., another low-K ILD, forming a capping layer on the second ILD and etching to form a trench in communication with the underlying via opening to complete the dual damascene opening.

21 Claims, 7 Drawing Sheets

DAMASCENE PROCESSING USING A SILICON CARBIDE HARD MASK

TECHNICAL FIELD

The present invention relates to a method of manufacturing a semiconductor device with accurately dimensioned interconnection patterns and exhibiting reduced capacitance loading. The present invention has particular applicability in manufacturing high density, multi-level semiconductor devices comprising sub-micron dimensions and exhibiting high circuit speed.

BACKGROUND ART

As integrated circuit geometries continue to plunge deeper into the submicron regime, it becomes increasingly difficult to satisfy the demands for dimensional accuracy. Moreover, interconnection technology is constantly challenged to satisfy the ever increasing requirements for high performance associated with ultra large scale integration semiconductor devices. The speed of semiconductor circuitry varies inversely with the resistance (R) and capacitance (C) of the interconnection system. The higher the value of the R×C product, the more limiting the circuit speed. As integrated circuits become complex and feature sizes and spacings become smaller, the integrated circuit speed becomes less dependent upon the transistor itself and more dependent upon the interconnection pattern. Thus, the performance of multi-level interconnects is dominated by interconnect capacitance at deep sub-micron regimes, e.g., less than about 0.12 micron. The rejection rate due to integrated circuits speed delays in sub-micron regimes has become a limiting factor in fabrication.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different levels, i.e., upper and lower levels, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as feature sizes shrink into the deep sub-micron regime.

A conductive plug filling a via hole is typically formed by depositing an interlayer dielectric (ILD) on a patterned conductive level comprising at least one conductive feature, forming an opening through the ILD by conventional photolithographic and etching techniques, and filling the opening with a conductive material. The excess conductive material or overburden on the surface of the ILD is typically removed by chemical-mechanical polishing (CMP). One such method is known as damascene and basically involves forming an opening in the ILD and filling the opening with a metal. Dual damascene techniques involve forming an opening comprising a lower contact or via hole section in communication with an upper trench section, which opening is filled with a conductive material, typically a metal, to simultaneously form a lower contact or via in electrical contact with a conductive line.

Copper (Cu) and Cu alloys have received considerable attention as alternative metallurgy to aluminum (Al) in interconnect metallizations. Cu is relatively inexpensive, easy to process, and has a lower resistively than Al. In addition, Cu has improved electrical properties vis-a-vis tungsten (W), making Cu a desirable metal for use as a conductive plug as well as conductive wiring. However, due to Cu diffusion through dielectric materials, such as silicon dioxide, Cu interconnect structures must be encapsulated by a diffusion barrier layer. Typical diffusion barrier materials include tantalum (Ta), tantalum nitride (TaN), titanium nitride (TiN), titanium-tungsten (TiW), Tungsten (W), tungsten nitride (WN), Ti—TiN, titanium silicon nitride (TiSiN), tungsten silicon nitride (WSIN), tantalum silicon nitride (TaSiN) and silicon nitride for encapsulating Cu. The use of such barrier materials to encapsulate Cu is not limited to the interface between Cu and the ILD), bat includes interfaces with other metals as well.

Cu interconnect technology, by and large, has been implemented employing damascene techniques, wherein a first dielectric layer, is formed over an underlying pattern having a capping layer thereon, e.g., a Cu or Cu alloy pattern with a silicon nitride capping layer. A barrier layer and optional seedlayer are then deposited, followed by Cu deposition, as by electrodeposition or electroless deposition.

The dielectric constant of materials currently employed in the manufacture of semiconductor devices for an interlayer dielectric (ILD) ranges from about 3.9 for dense silicon dioxide to over 8 for deposited silicon nitride. The value of a dielectric constant expressed herein is based upon a value of one for a vacuum. In an effort to reduce interconnect capacitance, dielectric materials with lower values of permitivity have bee explored. The expression "low-k" material has evolved to characterize materials with a dielectric constant less than about 3.9. One type of low-k material that has been explored are a group of flowable oxides which are basically ceramic polymers, such as hydrogen silsesquioxane (HSQ). Such polymers and their use are disclosed in, for example, U.S. Pat. Nos. 4,756,977 and 5,981,354. HSQ-type flowable oxides have been considered for gap filling between metal lines because of their flowability and ability to fill small openings. HSQ-type flowable oxides have been found to vulnerable to degradation during various fabrication steps, including plasma etching. Methods involving plasma treatment have been developed to address such problems attendant upon employing HSQ-type flowable oxides as a gap filling layer, as in the U.S. Pat. No. 5,866,945 and U.S. Pat. No. 6,083,851.

There are several organic low-k materials, typically having a dielectric constant of about 2.0 to about 3.8, which offer promise for use as an ILD. As used throughout this disclosure, the term "organic" is intended to exclude HSQ type materials, e.g., flowable oxides and ceramic polymers, which are not true organic materials. Organic low-k materials which offer promise are carbon-containing dielectric materials such as FLARE 2.0™ dielectric, a poly(arylene) ether available from Allied Signal, Advanced Microelectronic Materials, Sunnyvale, Calif., Black-Diamond™ dielectric available from Applied Materials, Santa Clara, Calif., BCB (divinylsiloxane bis-benzocyclobutene) and Silks™ an organic polymer similar to BCB, both available from Dow Chemical Co., Midland, Mich.

In implementing conventional damascene techniques, such as dual damascene techniques, the organic photoresist mask is typically removed employing an oxygen ($O_2$) plasma stripping technique after forming an opening in a dielectric layer, such as a via hole, trench or dual damascene technique comprising a lower via hole in communication with an upper trench however, in attempting to employ organic low-k materials in such interconnect technology, e.g., as an ILD, the $O_2$ plasma stripping technique disadvantageously also strips off and degrades a portion the organic low-k material, thereby adversely impacting device geometry and performance.

There exists a need for methodology enabling the use organic of low-k dielectric materials as an ILD in high density, multilevel interconnection patterns. There exist a particular need for methodology enabling the use of such organic low-k materials in damascene technology without removal or damage during photoresist stripping.

DISCLOSURE OF THE INVENTION

An advantage of the present invention is a method of manufacturing a semiconductor device with accurately dimensioned interconnection patterns, particularly Cu and/or Cu alloy interconnection patterns, and exhibiting reduced parasitic RC time delays employing organic dielectric materials having a low dielectric constant.

Additional advantages and other features of the present invention will be set forth in the description which follows and in part will be apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a first dielectric layer on a first capping layer overlying a lower metal level; forming a silicon carbide hard mask on the first dielectric layer; and etching to form a first opening having a cross-sectional width through the first dielectric layer exposing a portion of the capping layer.

Embodiments of the present invention comprise forming a via opening in the first dielectric layer, forming a second dielectric layer on the silicon carbide hard mask, forming a second capping layer on the second dielectric layer, forming a photoresist mask over the second capping layer, and anisotopically etching to form a trench opening, having a width greater than the cross-sectional width of the via opening, through the second capping layer and second dielectric layer while the silicon carbide hard mask advantageously protects the upper surface of the first dielectric layer under the trench. Etching is continued to remove exposed portions of the silicon carbide mask in the damascene opening, and through the exposed portion of the first capping layer exposing a portion of the lower metal feature. Embodiments of the present invention include filling the openings with Cu or a Cu alloy layer followed by planarization, as by chemical mechanical polishing (CMP), with subsequent deposition of a capping layer, such as silicon nitride.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded and illustrative in nature, and not as restrictive

DESCRIPTION OF THE INVENTION

Figure 1:
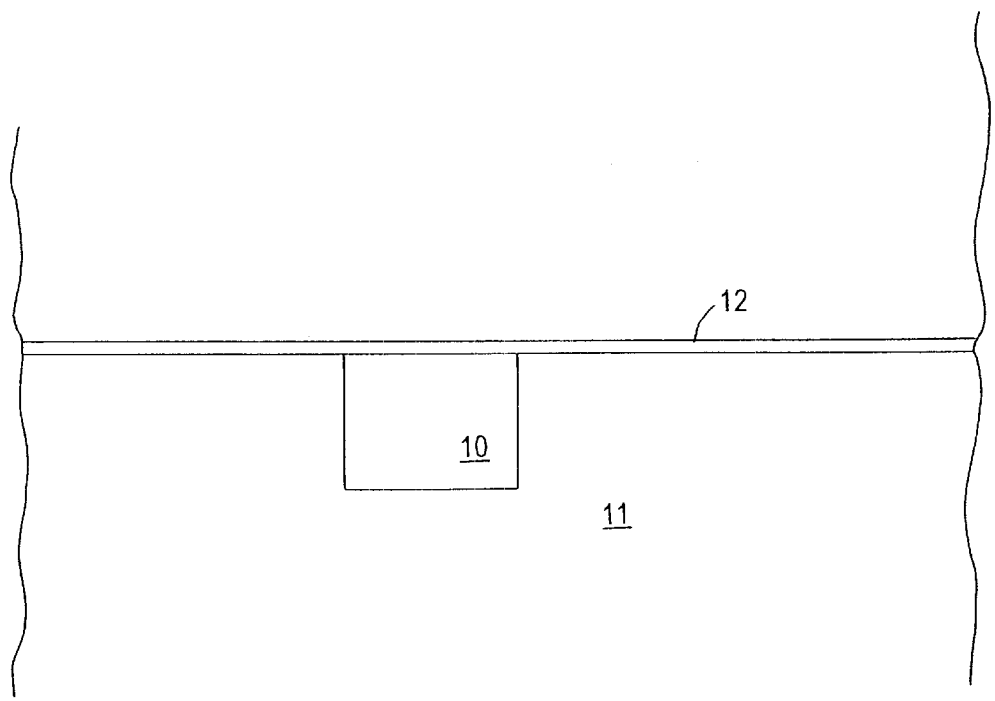
FIGS. 1 through 7 schematically illustrate sequential phases of a method in accordance with an embodiment of the present invention.

The present invention addresses and solves reliability problems attendant upon fabricating multi-layer interconnect semiconductor devices employing organic low-k materials to reduce parasitic RC time delays. The capacitance, both layer-to-layer and within-layer, is primarily attributed to the film properties of the ILD. The present invention provides methodology enabling the use of various organic low-k dielectric materials for ILDs, particularly in damascene techniques, such as dual damascene techniques, particularly via-first trench-last dual damascene techniques, without or with significantly reduced stripping and degradation of the low-k ILD, thereby improving dimensional accuracy and, hence, device reliability Upon attempting to employ various organic low-k materials as ILDs when implementing damascene techniques, it was found that portions thereof were stripped and that degradation occurred during stripping or the overlying organic photorosist mask, e.g., as when employing $O_2$ plasma stripping techniques. The present invention addresses and solves such problems attendant upon employing organic low-k materials for ILDs by strategically employing a silicon carbide hard mask. Embodiments of the present invention comprise depositing a layer of silicon carbide, as at a thickness of 300 Å to about 800 Å, e.g., about 500 Å on a low-k ILD, and then forming a thin organic photoresist mask, as at a thickness of about 1,000 Å to about 2,000 Å, e.g., about 1,200 Å to about 1,300 Å, on the layer of silicon carbide. Anisotropic etching is then conducted to form the silicon carbide mask having an opening substantially corresponding to a via opening. The photoresist mask is then removed as by $O_2$ plasma stripping . Advantageously, during removal of the photoresist mask, the low-k ILD is protected by the silicon carbide hard mask. Anisotropic etching is then conducted, using the silicon carbide hard mask, to form a via opening through the low-k ILD.

Subsequently, after formation of the via opening, an upper ILD is deposited, e.g., an organic low-k ILD. A capping layer, such as silicon nitride, is formed on the upper ILD. A photoresist mask defining a trench opening is then formed on the capping layer and anisotropic etching is conducted to form a trench opening. Advantageously, the silicon carbide hard mask protects most of the underlying low-k ILD during trench patterning. The dual damascene opening is then filled with Cu or a Cu alloy layer. As employed throughout this disclosure, the symbol Cu is intended to encompass high purity elemental copper as well as Cu-based alloys such as Cu alloys containing minor amounts of tin, zinc, manganese, titanium, germanium, zirconium, strontium, palladium, magnesium, chromium and tantalum.

A wide variety of organic low-k materials can be employed as an ILD in accordance with embodiments of the present invention, including various polyimides, BCB, FLARE™, Silk™, and Black-Diamond™ dielectrics. Other suitable low-k dielectrics include poly(arylene)ethers, poly(arylene)ether azoles; parylene-N, polyimides, polynapthalene-N, polyphenyl-quinoxalines (PPQ), polybenzoxazoles, polyindane, polynorbene, polystyrene, polyphenyleneoxide, polyethylene and polypropylene. It was found particularly suitable to employ SiCOH which exhibits a dielectric constant of about 3 and typically contains silicon in an amount of about 15 to about 18 at. %, eg., about 17 at. %, oxygen in an amount of about 28 to about 30 at. %, e.g., about 29 at. %, carbon in an amount of about 16 to about 18 at. %, e.g., about 17 at. % and hydrogen in an amount of about 36 to about 38 at. %, e.g., about 37 at. %. SiCOH contains SiC, SiH, CH and SiOH bonding.

An embodiment of the present invention is schematically illustrated in FIGS. 1 through 7, wherein like or similar features are denoted by the same reference numerals. Adverting to FIG. 1, reference numeral 10 denotes a lower metal feature such as a metal, e.g., Cu, line, formed in ILD 10 overlying a substrate or wafer (not shown). ILD 11 can comprise any conventional dielectric material or an organic low-k material. A capping layer 12, such as silicon nitride or silicon oxynitride is formed on ILD 11 and metal line 10.

Figure 2:
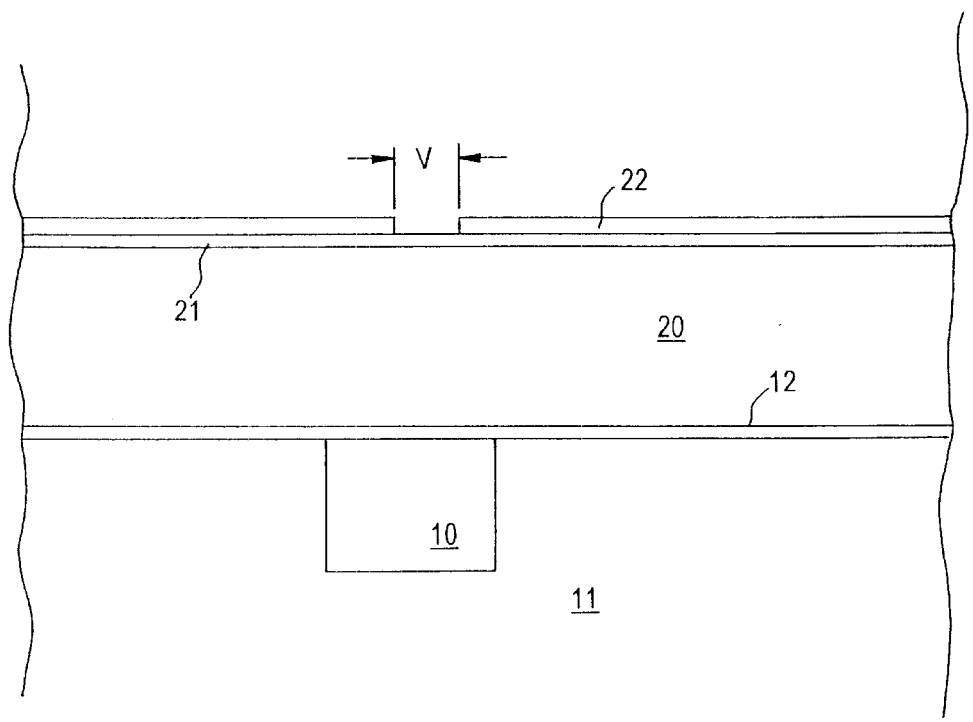

As illustrated in FIG. 2, an organic low-k ILD 20, such as SiCOH, is deposited over ILD 11 on capping layer 12. A layer of silicon carbide 21, at a thickness suitable to function as a hard mask, such as about 300 Å to about 800 Å, e.g., about 500 Å, is deposited on ILD 20, as by chemical vapor deposition (CVD). A relatively thin organic photoresist mask 22 is then formed on silicon carbide layer 21; as at a thickness of about 1,000 Å to about 2,000 Å, e.g., about 1,200 Å to about 1,300 Å. Photoresist mask 22 contains an opening "V" substantially corresponding to the cross-sectional width a via opening to be formed in ILD 20. Advantageously, the use of a silicon carbide hard mask significantly reduces the amount of organic photoresist material required, so that photoresist mask 22 can be formed at a relatively minimal thickness.

Figure 3:
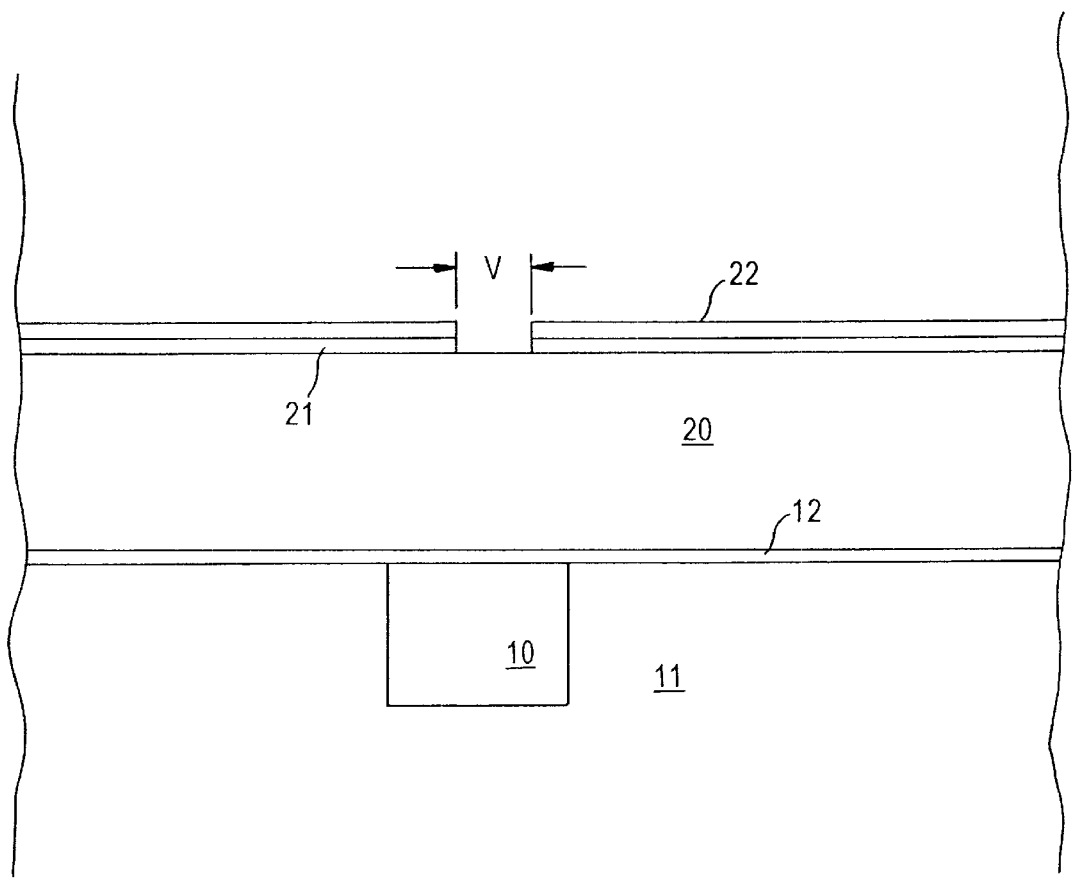
Figure 4:
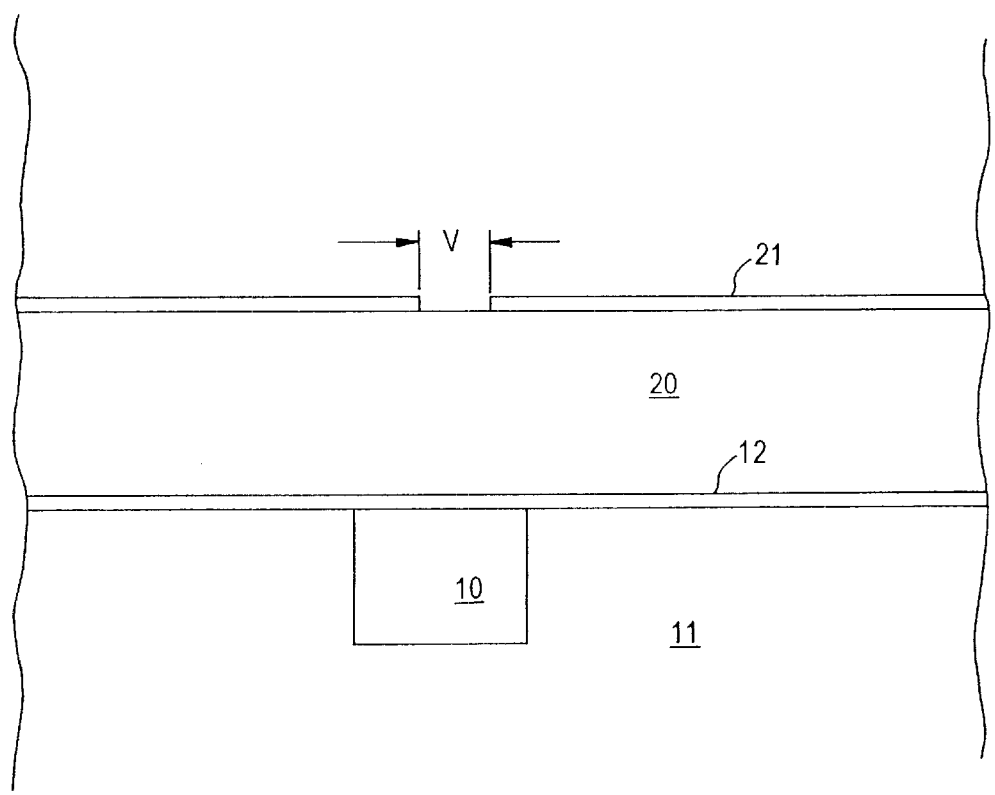

As shown in FIG. 3, anisotropic etching is conducted to extend opening "V" into silicon carbide layer 21 stopping on organic low-k ILD 20 employing an etching recipe with high selectivity to ILD 20. Subsequently, as shown in FIG. 4, organic photoresist mask 22 is removed, as by $O_2$ plasma stripping. Advantageously, the presence of silicon carbide hard mask 21 on the upper surface of organic low-k ILD 20 protects ILD 20 from removal and degradation while stripping organic photoresist mask 22.

Figure 5:
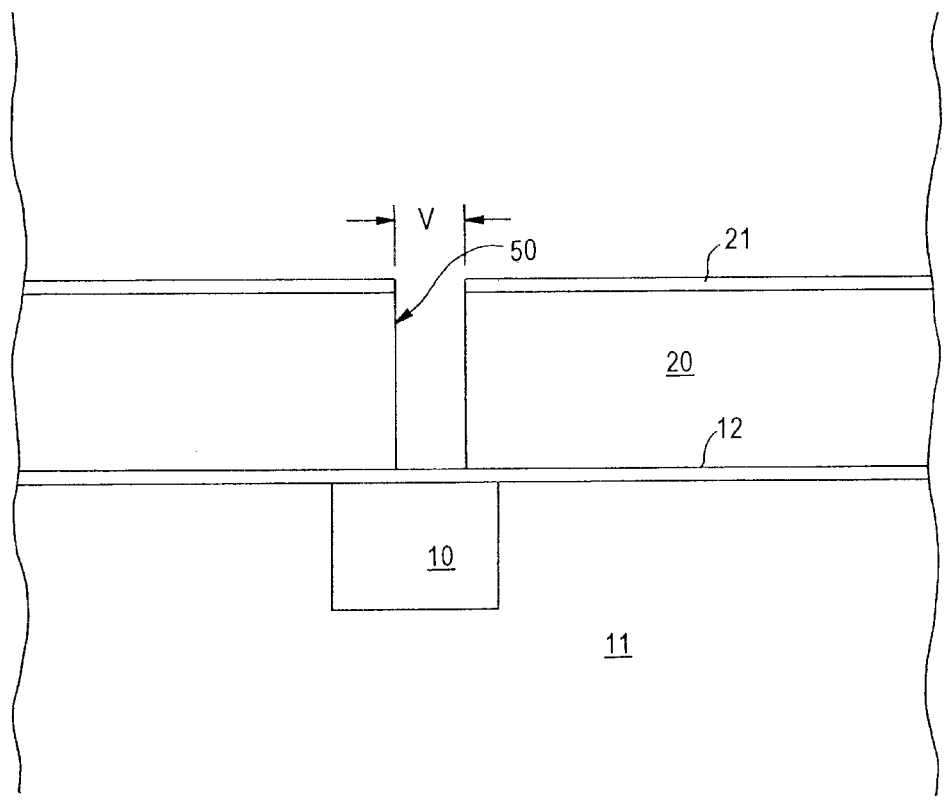

As shown in FIG. 5, anisotropic etching is then conducted to form via opening 50, having a cross-sectional width substantially corresponding to "V" stopping on capping layer 12. The use of silicon carbide hard mask 21 to protect ILD 20 against removal and degradation during $O_2$ plasma stripping of organic photoresist mask 22, enables via opening 50 to be formed with high dimensional accuracy.

Figure 6:
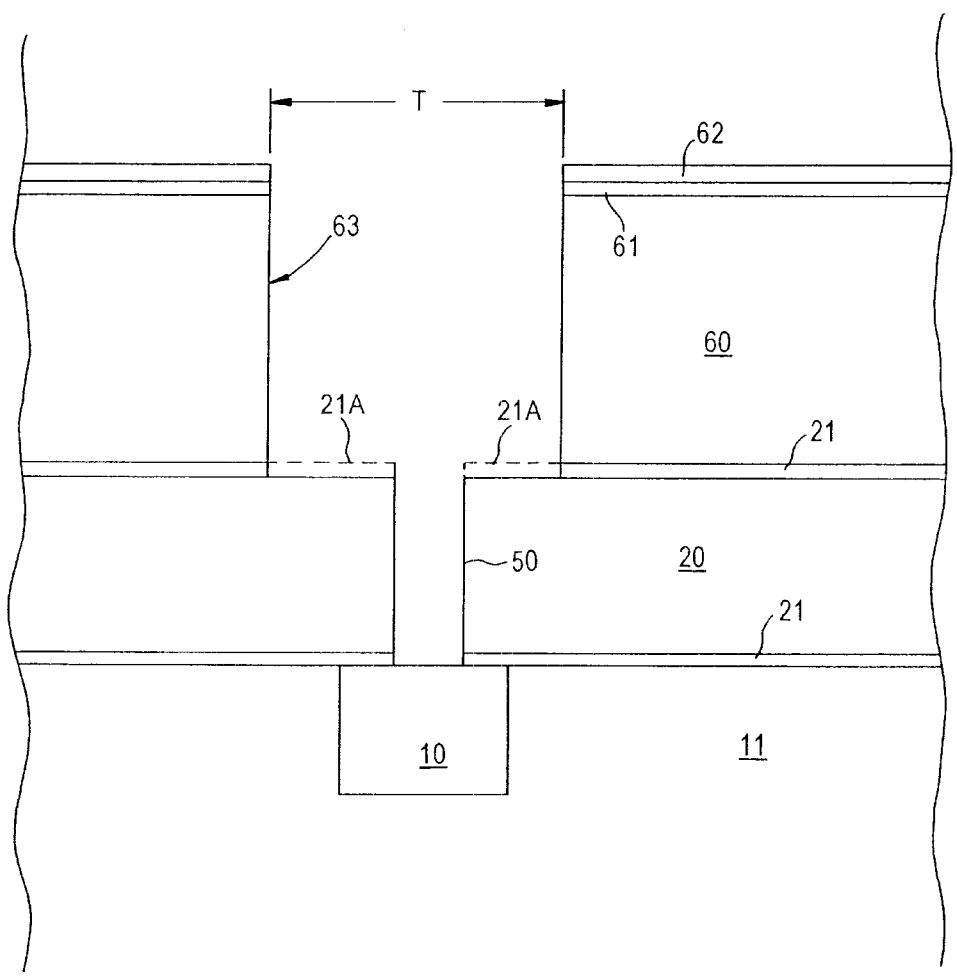

Adverting to FIG. 6, ILD 60 is formed over ILD 20 on silicon carbide mask 21. ILD 60 can also comprise an organic low-k dielectric material, or any conventional dielectric material employed in manufacture of semiconductor devices. A capping layer 61, such as silicon nitride or silicon oxynitride, is then formed on ILD 60 and a photoresist mask 62, having an opening "T", substantially corresponding to the width of the trench to be formed in ILD 60, is formed on capping layer 61. Anisotropic etching is then conducted through capping layer 61 into ILD 60 to form trench 63 having a width substantially corresponding to "T". Advantageously, the portions of silicon carbide mask 21 (illustrated by reference numeral 21A and shown in phantom) protect the upper surface or organic low-k ILD 20 during formation of trench 63. Anisotropic etching is continued until portions 21A of silicon carbide mask within the dual damascene opening are removed and the upper surface of lower metal feature 10 exposed, thereby completing formation of dual damascene opening comprising via opening 50 in communication with overlying trench 63.

Figure 7:
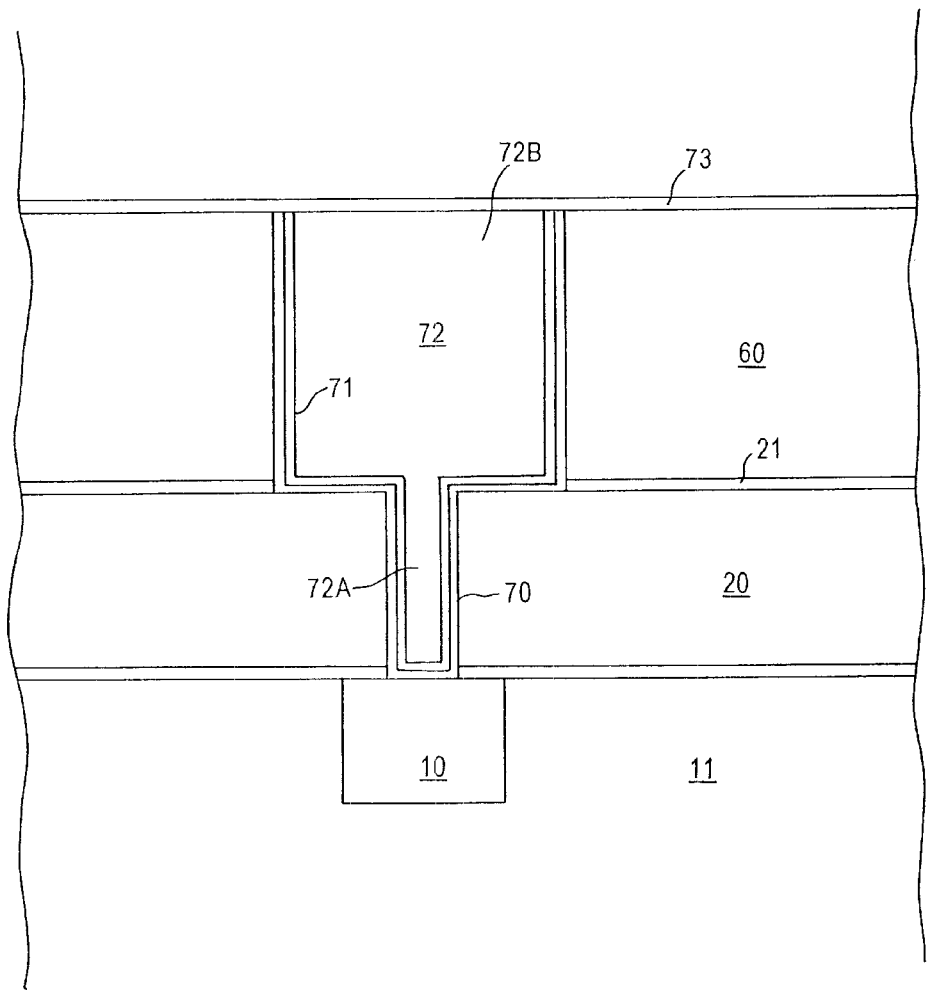

Subsequently, as illustrated in FIG. 7, the dual damascene opening is filled with metal. In an embodiment of the present invention, the dual damascene opening is filled with Cu by electroplating or electroless plating. Accordingly, consistent with the conventional practices, a barrier layer 70 is initially deposited to line the dual damascene opening, such as Ta or TaN. Seed layer 71, such as a Cu alloy containing magnesium, aluminum, zinc, zirconium, tin, nickel, palladium, silver or gold in a suitable amount, e.g., about 0.3 to about 12 at. %, is then deposited. Cu 72 is then deposited, as by electroplating or electroless plating, to fill the dual damascene opening and form an overburden. Subsequently, CMP is conducted so that the upper surface of the deposited Cu 72 is substantially coplanar with the upper surface of ILD 60. The resulting filled dual damascene opening comprises via 72A in electrical contact with lower metal feature 10 and connected to Cu line 72. Subsequently, a capping layer 73, such as silicon nitride, is deposited.

The present invention provides methodology enabling the manufacture of semiconductor devices having accurately dimensioned interconnect patterns with increased circuit speed and reduced parasitic capacitance employing organic low-k ILDs and Cu metallization The present invention enjoys industrial applicability in manufacturing highly integrated semiconductor devices exhibiting increased circuit speed and sub-micron dimensions, e.g., with a design rule of about 0.12 micron and under. The present invention includes the use of various metals for the interconnection system, particularly Cu and Cu alloys, employing both single and dual damascene techniques.

In the preceding detailed description, the present invention is described with reference to specifically exemplary embodiments thereof It will, however, be evident that various modifications and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed:

1. A method of manufacturing a semiconductor device, the method comprising sequentially:

forming a first dielectric layer on a first capping layer overlying a lower metal level;

forming a silicon carbide hard mask on the first dielectric layer;

etching to form a first opening having a cross-sectional width through the first dielectric layer exposing a portion of the capping layer;

forming a second dielectric layer on the silicon carbide hard mask; and etching to form a second opening, having a width greater than the cross-sectional width of the first opening, through the second dielectric layer, while the silicon carbide hard mask protects an upper surface of the first dielectric layer; and continuing etching to remove a portion of the silicon carbide hard mask on the first dielectric layer and etching through the exposed portion of the first capping layer.

2. The method according to claim 1, comprising forming the silicon carbide hard mask by:

depositing a layer of silicon carbide on the first dielectric layer;

forming a photoresist mask on the silicon carbide layer;

etching an opening in the silicon carbide layer stopping on the first dielectric layer to form the silicon carbide hard mask; and stripping the photoresist mask from the silicon carbide hard mask.

3. The method according to claim 2, comprising forming the photoresist mask at a thickness of about 1,000 Å to about 2,000 Å.

4. The method according to claim 3, comprising depositing the layer of silicon carbide at a thickness of about 300 Å to about 800 Å.

5. The method according to claim 1, further comprising:

forming a second capping layer on the second dielectric layer;

forming a photoresist mask on the second capping layer; and etching to form the second opening through the second capping layer and second dielectric layer.

6. The method according to claim 2, further comprising:

forming a second dielectric layer on the silicon carbide hard mask;

forming a second capping layer on the second dielectric layer;

forming a photoresist mask over the second capping layer; and etching to form a second opening, having a width greater than the cross-sectional width of the first opening, through the second capping layer and second dielectric layer while the silicon carbide hard mask protects an upper surface of the first dielectric layer.

7. The method according to claim 6, comprising continuing etching to remove a portion of the silicon carbide hard mask on the first dielectric layer and etching through the exposed portion of the first capping layer exposing a portion of the lower metal feature.

8. The method according to claim 6, wherein:

the first opening constitutes a via opening; and the second opening constitutes a trench.

9. The method according to claim 8, comprising filling the via opening and trench with a metal to form a via in electrical contact with a metal line.

10. The method according to claim 9, comprising filling the via opening and trench with copper (Cu) or a Cu alloy.

11. The method according to claim 1, wherein the first dielectric layer comprises material having a dielectric constant less than about 3.

12. The method according to claim 1, wherein the second dielectric layer comprises a material having a dielectric constant less then about 3.

13. The method according to claim 12, wherein the first dielectric layer comprises material having a dielectric constant less than about 3.

14. The method according to claim 1, wherein the first capping layer comprises silicon nitride.

15. The method according to claim 1, wherein the first capping layer comprises silicon nitride.

16. The method according to claim 6, wherein the first capping layer comprises silicon nitride.

17. The method according to claim 16, wherein the second capping layer comprises silicon nitride.

18. The method according to claim 2, comprising stripping the photoresist mask with an oxygen plasma.

19. A method of manufacturing a semiconductor device, the method comprising:

forming a first dielectric layer on a first capping layer overlying a lower metal level;

depositing a layer of silicon carbide on the first dielectric layer; forming a photoresist mask, having a thickness of 1,200 Å to 2000 Å, on the silicon carbide layer;

etching an opening in the silicon carbide layer stopping on the first dielectric layer to form the silicon carbide hard mask;

stripping the photoresist mask from the silicon carbide hard mask; and etching to form a first opening having a cross-sectional width through the first dielectric layer exposing a portion of the capping layer.

20. The method according to claim 19, comprising the layer of silicon carbide at a thickness of about 300 Å to about 500 Å.

21. The method according to claim 19, wherein the first dielectric layer comprises SiCOH.

* * * * *